United States Patent
Stuve et al.

(10) Patent No.: US 7,570,047 B2
(45) Date of Patent: Aug. 4, 2009

(54) HALL EFFECT BASED ANGULAR POSITION SENSOR

(75) Inventors: Steven R. Stuve, Lake Mills, WI (US); Kevin P. O'Connor, Lake Mills, WI (US)

(73) Assignee: Key Safety Systems, Inc., Sterling Heights, MI (US)

( * ) Notice: Subject to any disclaimer, the term of this patent is extended or adjusted under 35 U.S.C. 154(b) by 297 days.

(21) Appl. No.: 11/764,313

(22) Filed: Jun. 18, 2007

(65) Prior Publication Data

US 2008/0309324 A1    Dec. 18, 2008

(51) Int. Cl.
G01B 7/30    (2006.01)
(52) U.S. Cl. .................. 324/207.2; 324/207.25
(58) Field of Classification Search .............. 324/207.2, 324/207.25
See application file for complete search history.

(56) References Cited

U.S. PATENT DOCUMENTS

| | | | |
|---|---|---|---|
| 5,712,478 A | 1/1998 | Olsson | |
| 5,831,554 A | 11/1998 | Hedayat et al. | |
| 6,252,394 B1 | 6/2001 | Roze et al. | |
| 6,316,935 B1 | 11/2001 | Vanzuilen | |
| 6,469,499 B2 * | 10/2002 | Delaporte | 324/207.13 |
| 6,879,240 B2 | 4/2005 | Kruse | |
| 7,070,226 B2 * | 7/2006 | Cleland et al. | 296/146.8 |
| 2007/0040355 A1 | 2/2007 | Spratte et al. | |

FOREIGN PATENT DOCUMENTS

| | | |
|---|---|---|
| EP | 1059512 A2 | 12/2000 |
| KR | 10-2004-0001880 A | 1/2004 |
| WO | 2005/021295 A1 | 3/2005 |

OTHER PUBLICATIONS

"Trough-shaft contactless magnetic sensor wit a stroke up to 360°", Jerance Nikola et al., presented at Sensors Conference (Nürnberg), May 2007, website printout.
"MLX90316 Rotary Position Sensor IC", published May 1, 2007, Melexis websire printout, http://www.melexis.com/ProdMain.aspx?nID=566.
"360 Degree Rotary Position Sensing with Novel Hall Effect Sensors", Vincent M. Hiligsmann, published Mar. 1, 2006, Sensors website printout, http://www.sensorsmag.com/sensors/content/printContentPopup.jsp?id=313845.
"Understanding Integrated Hall Effect Rotary Encoders / How Hall-based rotary encoders work", Josef Janisch, published Nov. 1, 2006, Sensors website printout, http://www.sensorsmag.com/sensors/content/printContentPopup.jsp?id=38302.

* cited by examiner

*Primary Examiner*—Jay M Patidar
(74) *Attorney, Agent, or Firm*—Lonnie Drayer; Patrick Stiennon

(57) ABSTRACT

A magnetic rotational position sensor that employs a single magnet mounted on a rotating turret that rotates on a housing that is fixedly mounted about a fixed ball stud. The turret is arranged to rotate around the ball stud in a first plane. A magnetic field orientation sensor is mounted to the housing, such that the magnet rotates along an arc tangent to the Hall effect sensor. The ball of the ball stud forms one half of a universal joint, the other half being formed by a shaft termination that is mounted to rotate with the turret, and also mounted for rotation in a second plane perpendicular to the first plane of the turret.

17 Claims, 4 Drawing Sheets

HALL EFFECT BASED ANGULAR POSITION SENSOR

FIELD OF THE INVENTION

The present invention relates to rotary position sensors that employ Hall effect sensors.

BACKGROUND OF THE INVENTION

Rotary position sensors have long been used in machines of every type, particularly articulated machinery such as robotic arms. Position sensors can be based on shaft encoders, either optical or magnetic for example monitoring a magnetic pattern impressed on a bearing race with a Hall effect or other magnetic sensor. A problem with many sensors is that they simply count pulses of an optical or magnetic nature as one part rotates with respect to another. Such sensors are accurate in determining rotational velocity and can be accurate for position so long as an initial starting position is known. However, in some applications power may be interrupted and so position sensing may require resetting the rotational joint or arm to a zero or calibration position. One type of recently developed sensor is based on Triaxis™ Hall technology from Melexis Microelectronic Integrated Systems NV (Brussels) and uses integrated magnetic concentrators (IMC) to allow 360° position sensing based on the rotation of a magnet with a north-south pole on-axis with an array of four Hall effect sensors. For best accuracy, these types of sensors require a rotating magnet to be relatively accurately positioned over the sensor and of a certain size. In certain applications the advantages of absolute position measurement from when the power is turned on are desirable, while at the same time rotational movement of less than 360° is sufficient. Further a packaging arrangement that measures only rotation in one plane of a shaft that is moving in two planes is desirable.

SUMMARY OF THE INVENTION

The magnetic rotational position sensor of this invention employs a single diametrically magnetized magnet mounted on a rotating turret that rotates about a single axis on a housing. The housing is mounted fixedly about a fixed ball stud and the turret is arranged to rotate around the ball stud in a plane. A magnetic field orientation type Hall effect sensor is mounted to the housing, such that the magnet rotates about 45° on either side of the sensor along an arc tangent to the sensor. The ball of the ball stud forms one half of a universal joint, the other half being formed by a shaft termination that is mounted to the ball stud. The turret is arranged to rotate with the shaft termination, to the extent the shaft termination rotates about the axis of rotation of the turret. The turret is connected to the shaft termination by trunnions, i.e., cylindrical or arcuate protrusions used as mounting points, which allow the shaft termination to rotate about an axis perpendicular to the axis of rotation of the turret. Thus the shaft functions like a gun barrel mounted to a gun turret, with the shaft termination taking the place of the gun barrel, and arranged to rotate in azimuth about the rotational axis of the turret and in elevation about the rotational axis of the trunnions, however, the magnet mounted to the turret rotates only in azimuth and this rotation alone is detected and measured by the magnetic field orientation sensor.

The rotational position sensor can be used positioned about a fixed ball stud to which is mounted one end of a gas strut used to support an automobile liftgate or rear hatch, the liftgate being an upward-opening door connected by one or more hinges to the automobile at an uppermost portion. The gas strut is connected between the automobile frame and the liftgate and acts as a spring that supports or balances some or all of the weight of the liftgate. When the liftgate is powered by an actuator so that the liftgate can be opened or closed automatically it is important to know the current position of the liftgate, in order to properly drive and control the liftgate actuator. As the liftgate pivots open about its hinges, the gas strut extends and rotates with a rotation that corresponds to the extension of the strut. The liftgate rotates about the axis defined by the liftgate hinge(s). Typically the gas struts will not lie precisely in a plane perpendicular to the axis defined by the liftgate hinge, and so the gas strut will rotate in two planes, but for purposes of monitoring the extent to which the liftgate is opened, monitoring rotation in a single plane substantially perpendicular to the hinge(s) axis is sufficient.

The position sensor of this invention allows determination of the true position of the liftgate at any point between fully closed and fully open, by monitoring rotation of the gas strut in a single plane. The sensor measures absolutely the position of the magnet with respect to the magnetic field orientation sensor so that the position of the sensor is recognized when power is turned on. Such a true position sensor allows the liftgate to be driven open or closed after power is turned on, without necessitating opening or closing the liftgate in order to start the liftgate from a known position.

It is a feature of the present invention to provide a magnetic rotational sensor that can determine position at the time the power is turned on.

It is another feature of the present invention to provide a position sensor that accommodates rotation in two planes but measures rotation in one plane only.

It is a further feature of the present invention to provide an angular position sensor where the sensor magnet is not on-axis with a magnetic field sensor.

Further features and advantages of the invention will be apparent from the following detailed description in conjunction with the accompanying drawings.

DETAILED DESCRIPTION OF THE INVENTION

Figure 1:
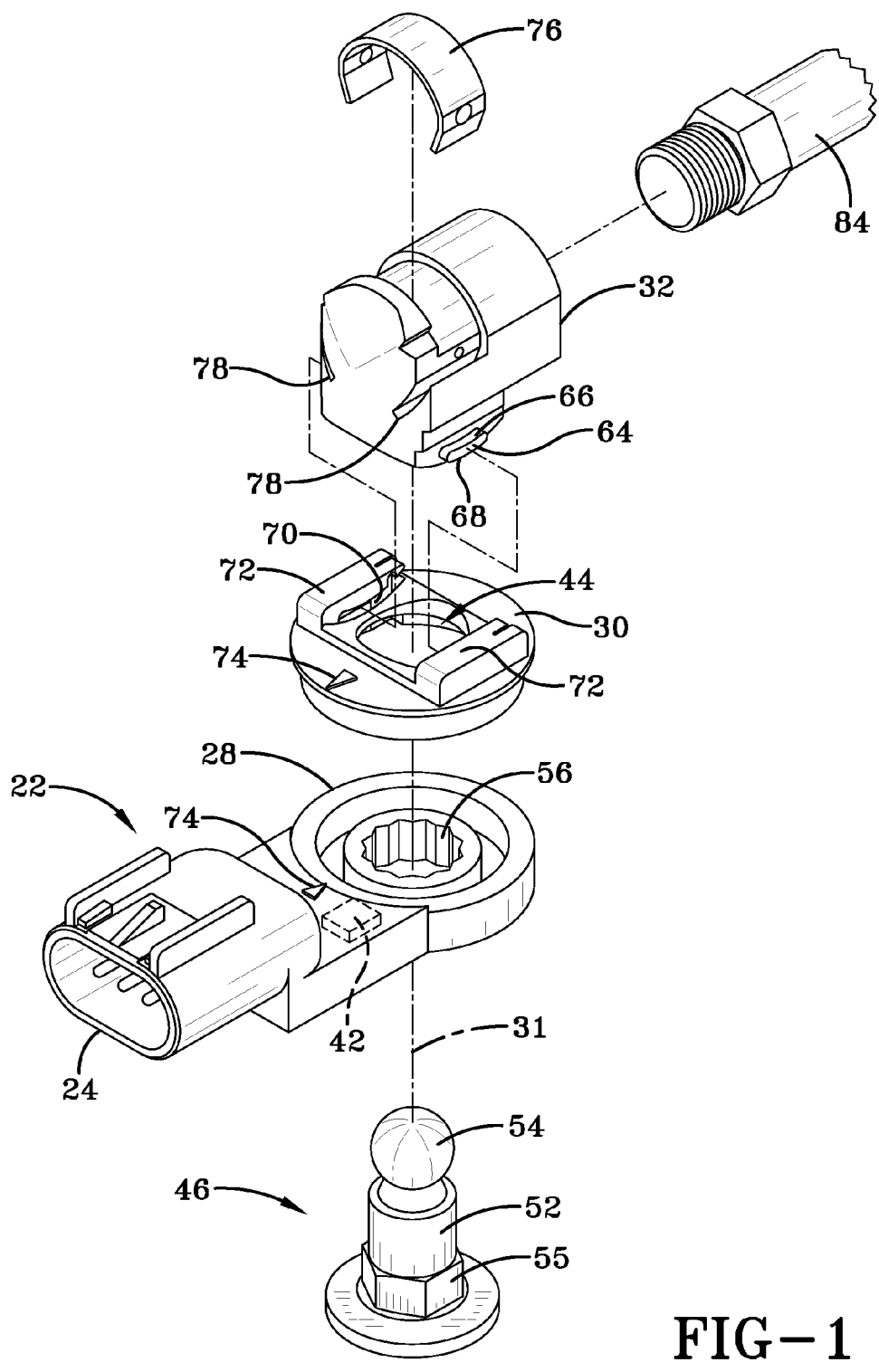
FIG. 1 is an exploded isometric view of the rotational position sensor of this invention.
Figure 2:
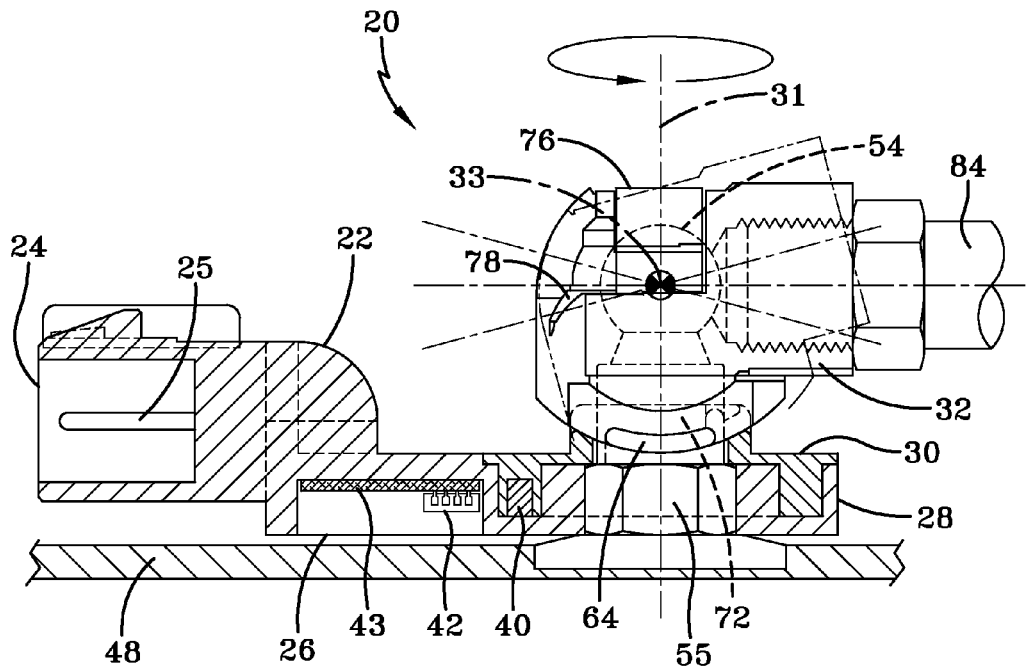
FIG. 2 is a side elevation view partly cut away of the rotational position sensor of FIG. 1.

Referring to FIGS. 1-5 wherein like numbers refer to similar parts a rotational position sensor 20 is shown in FIG. 2. The sensor 20 has a housing 22 with three portions: a plug 24, an electronics receptacle 26 extending from the plug, and a turret track portion 28 extending from the receptacle. A rotatable turret 30 is mounted for rotation about a first axis 31 on the turret track portion 28 of the housing, and is connected to a shaft termination 32 by a joint that provides a second axis 33 of rotation perpendicular to the first axis. The shaft termination 32 provides a mechanical connection to some element, for example to the piston rod 84 of a vehicle tailgate gas strut 82.

Figure 3:
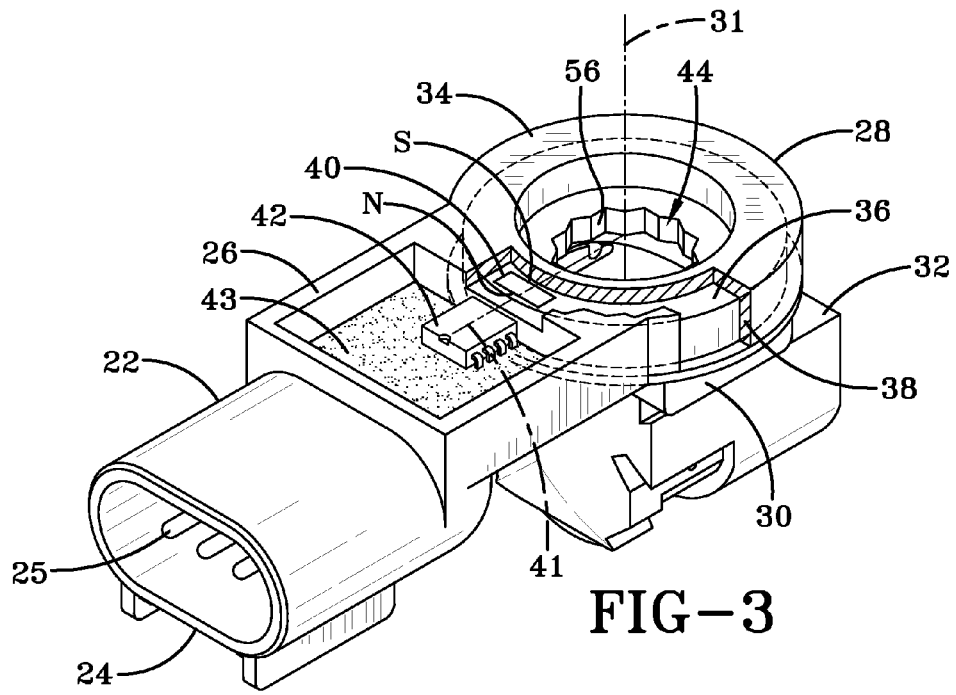
FIG. 3 is a cutaway bottom isometric view of the rotational position sensor of FIG. 1.

As shown in FIG. 3, where the underside 34 of the sensor 20 is shown, the turret 30 has a cylindrical base 36 which rotates in a bearing 38 formed by the turret track portion 28 of the housing 22. A recess in the turret cylindrical base 36 contains a diametrically magnetized magnet 40 with a north pole N and south pole S oriented along a radial line passing through the center of rotation 31 of the turret 30 with the north pole N arranged closest to a magnetic field sensor 42. The orientation of the magnetic fields produced by the magnet 40 is sensed by the magnetic field orientation sensor 42, most particularly part number MLX90316 from Melexis Microelectronic Integrated Systems NV (Brussels). The magnetic field sensor 42 is mounted to a printed circuit board 43 which is encapsulated with epoxy or overmolded with polyamide in the electronics receptacle portion 26 of the housing 22. The magnetic field sensor 42 is positioned adjacent the turret track portion 28 of the housing extending along a line 41 that intersects the first axis 31.

Figure 4:
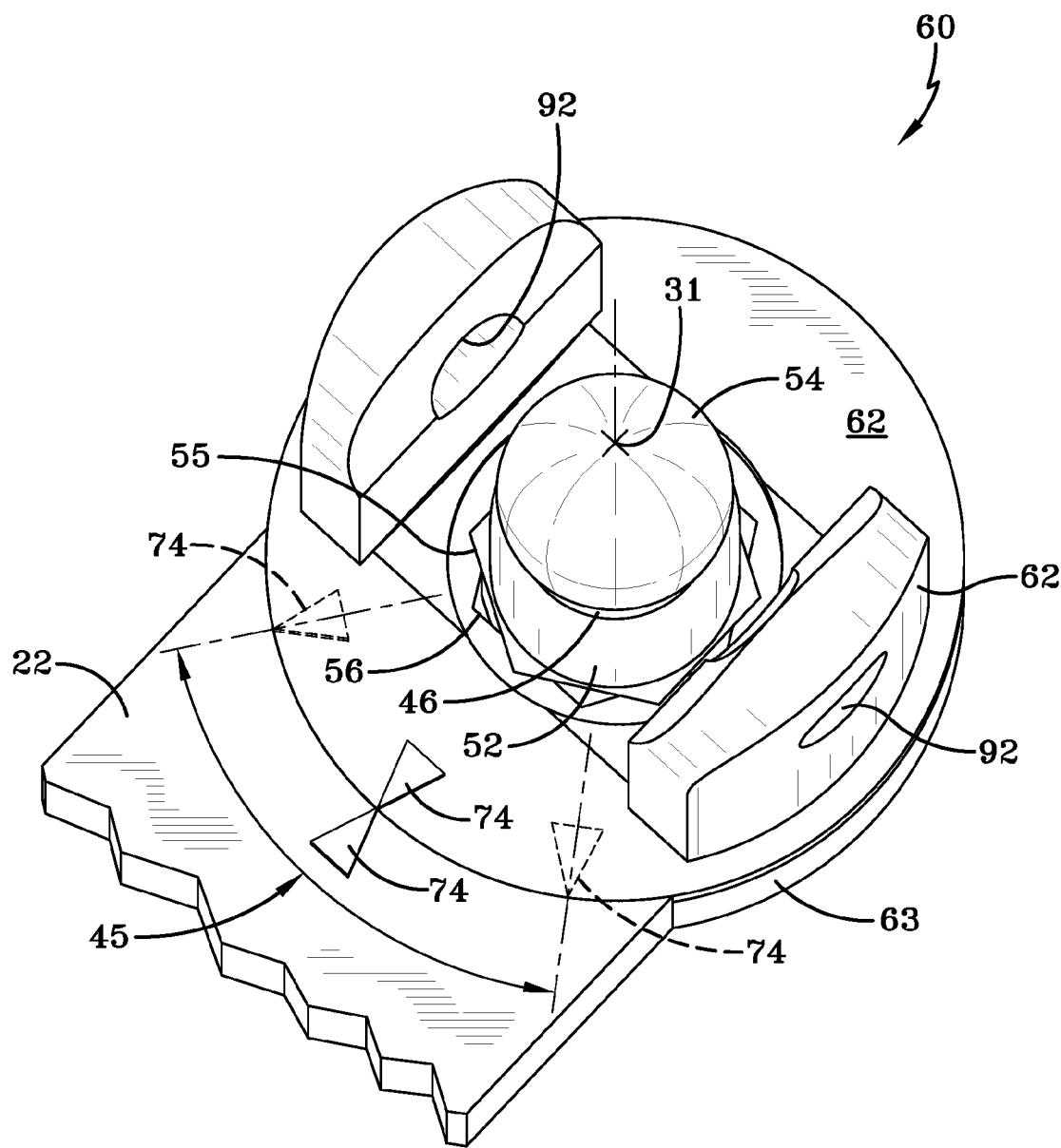
FIG. 4 is a top isometric view of a portion of an alternative embodiment of the rotational position sensor of this invention.

The plug 24 has three leads 25 comprising power, ground, and data leads which connect to the printed circuit board 43 and hence to the magnetic field orientation sensor 42. As shown in FIG. 4, the magnet 40 rotates with the turret 30 along an arc 45 which is spaced from the magnetic field orientation sensor 42, the arc extends 45° to 50° on either side of the line 41 shown in FIG. 3 connecting the magnetic field orientation sensor 42 to the first axis 31.

Figure 5:
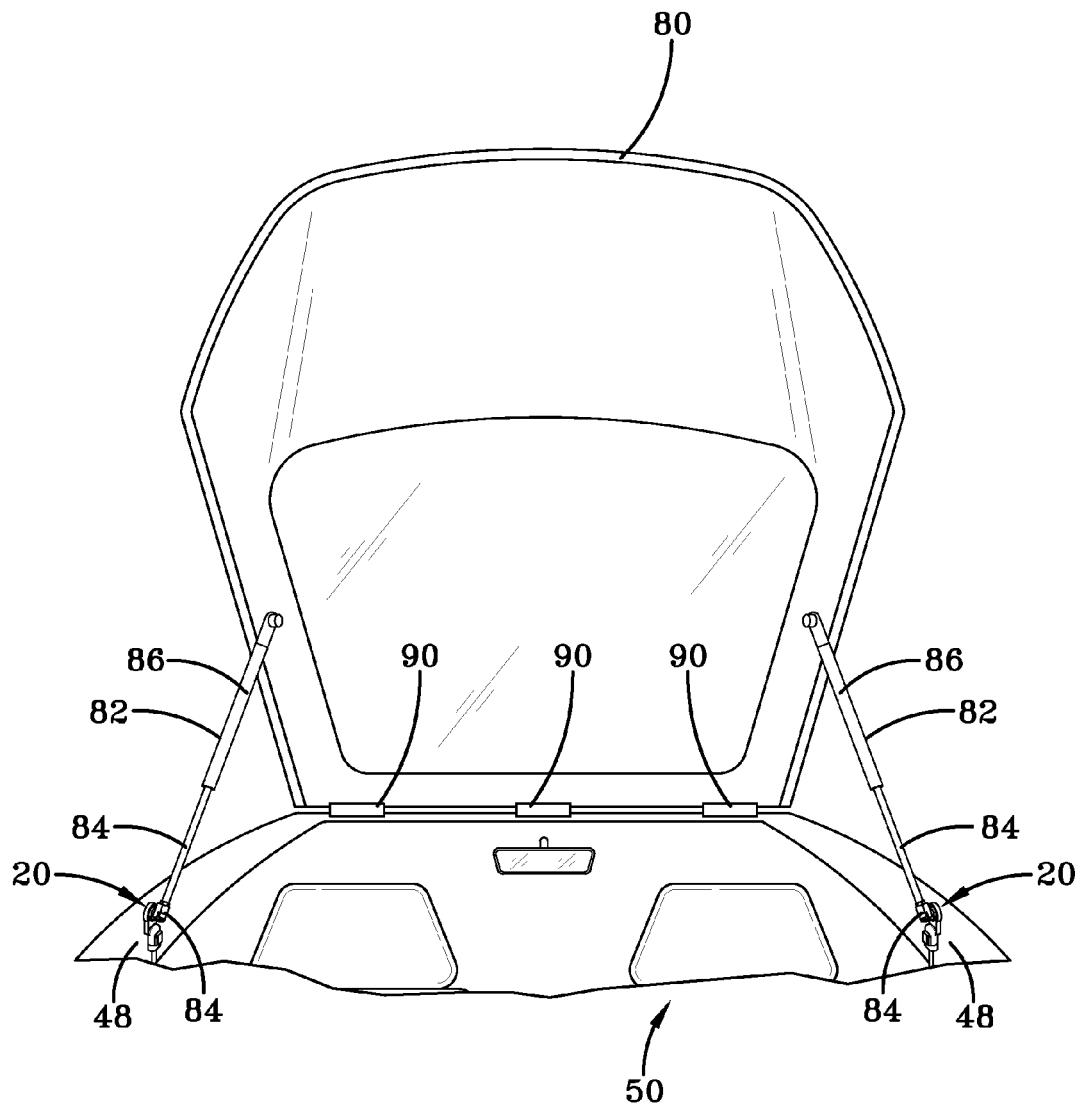
FIG. 5 is a rear elevation view of an automobile liftgate showing how the position sensor of FIG. 1 may be used.

The turret 30 has a central opening 44 through which a ball stud 46 extends as shown in FIGS. 1 and 4. The ball stud 46 is fixed to a surface 48 such as a portion of an automobile 50 as shown in FIG. 5, and extends through the turret track portion 28 of the housing 22 and central opening 44 of the turret to engage the shaft termination 32. The ball stud 46 has a shank 52 terminated by a ball 54. A polygonal or hexagonal nut 55 is formed integral to the shank at the base of the shank, and locks with a ratchet cone 56 formed as part of the turret track portion 28 of the housing 22. The ratchet cone 56 defines an opening in the housing 22 through which the ball stud 46 extends.

As shown in FIGS. 2 and 4 the housing 22, 63, by means of the ratchet cone 56, is locked against rotation while the turret 30, 62 is free to rotate about the ratchet cone 56.

As shown in FIG. 2, the shaft termination 32 is mounted for rotation to the turret 30 in elevation about the second axis 33, and the turret is mounted for rotation in azimuth about the first axis 31 on the bearing 38 of the housing turret track portion 28. The shaft termination 32 has oblong trunnions 64 which protrude from the body of the shaft termination. The turret 30 has portions 72 on either side of the opening the opening 44 though which the ball stud 46 extends. Arcuate tracks 70 are formed in the turret portions 72. The trunnions 64 have an upper arcuate surface 66 and a lower arcuate surface 68 that ride in the arcuate tracks 70. The trunnions 64 are captured within the arcuate tracks 70 and cause the turret to rotate with the shaft termination 32 about the first axis 31 that is also an axis of symmetry of the ball stud 46. Rotation of the turret 30 moves the magnet 40. Movement of the magnet is sensed by the magnetic field orientation sensor 42 which outputs a value proportional to the rotation of the turret 30 with respect to a nominal position such as that indicated by the witness mark 74 shown in FIG. 1.

The shaft termination 32 forms a universal ball joint i.e., a joint with two rotational degrees of freedom, with the ball 54 of the ball stud 46. The universal joint is formed by spherical surfaces (not shown) within the shaft termination 32 which ride on the ball 54 allowing both rotation in azimuth about the axis 31 about which the shank 52 and ball 54 are centered, and rotation in elevation about the axis 33. Rotation of the shaft termination 32 about the first axis 31 is transmitted by the turret trunnions 64 to the turret 30 causing the magnet 40 to rotate and driving the output of the magnetic field sensor 42. Rotation about the second axis 33 is permitted but has no effect on the position of the magnet 40 or the output of the magnetic field sensor 42. The shaft termination 32 is mounted over the ball 54 of the fixed ball stud 46 and locked in place by a C-shaped spring retainer 76 which is positioned within slots 78 formed in the shaft termination 32 which extend below the ball 54 allowing the ends of the C-shaped spring retainer to slide under the ball 54 capturing it within the shaft termination 32.

As shown in FIG. 5, the rotational positional sensor 20 finds application in measuring the open position of a vehicle hatchback or liftgate 80. The liftgate 80 is supported by a pair of gas struts 82. Each gas strut has a piston rod 84 in a cylinder 86. Compressed gas in the cylinder 86 acts against a piston (not shown) that terminates the piston rod 84 to form a gas spring. The extension of the gas struts 82 is directly correlated with the position of the liftgate 80, because extension of the gas struts causes a rotation of the shaft terminations 32 connected to the piston rods 84 of the gas struts mounted to the fixed ball studs 46 on the automobile 50. The rotation occurs as the liftgate 80 opens about an axis defined by hinges 90 which mount the liftgate to the automobile 50. The rotation of the shaft termination 32 about the axis of symmetry of the ball stud 46, which is approximately parallel e.g., 0-30 degrees, to the axis defined by the hinges 90, in turn is measured by the position sensor 20. This measurement can be correlated directly to the position of the liftgate, or how much the liftgate is open. Because of the type of sensor used, an absolute angular position is provided without needing reference to a particular starting position.

The turret 30 mounted for rotational movement in a plane is not unlike the turret of a gun mount which allows the gun to be rotated in azimuth. The shaft termination 32 functions as the gun barrel which is mounted by the trunnions 64 which provides rotation in elevation. In FIGS. 1-3 the trunnions 64 follow arcuate tracks 70 to allow rotation above the center of curvature of the tracks 70. The center of curvature of both tracks when joined together passes through the center of the ball 54. A geometrically similar arrangement is shown in FIG. 4 where an alternative embodiment turret 62 mounted to the sensor 60 has portions forming cylindrical openings 92 to receive more conventional cylindrical trunnions (not shown) which are mounted to a shaft termination (not shown). A generic description of the mechanism of the position sensor 20 is that of a shaft termination mounted by a universal joint to a fixed structure, and a magnetic field sensor fixedly mounted with respect to the fixed structure which can uniquely detect the rotational position of a magnet along an arc. Between the shaft termination and the fixed structure is a turret to which the magnet is mounted, the turret forming a structure mounted to the fixed structure with a single degree of freedom and linked to the shaft termination by a second degree of freedom, i.e. a hinge, such that the shaft termination retains two degrees of freedom, i.e. the joint remains universal or not restricted. The single degree of freedom of the turret produces rotation in a single plane that moves the magnet and provides an output from the magnetic field sensor that reflects only rotation about a single axis.

The magnetic field sensor 42 is advantageously of a type which measures field orientation as opposed to field strength. For example Melexis part number MLX 90316 measures field orientation over a wide range of magnetic field strengths of 200-700 gauss, so that as the magnet moves along an arc approximately 40 to 50° or less on either side of the closest approach to the magnetic field sensor 42, the output of the sensor is not the field strength as the magnet moves further away from the magnetic field sensor 42 rather the orientation of the fields generated by the magnet is the output. Having the N pole face the chip results in reasonable linearity in change in field direction at the chip as the magnet rotates along the arc of approximately 40 to 50°, and keeps the field strong enough for the chip to function. On the other hand, the magnetic field sensor 42 could be a Hall effect sensor, a magnetoresistive sensor, a giant magnetoresistive sensor, a coil, or some other type of sensor that measures field strength. Where a field strength sensor is used, the orientation of the north-south poles of the diametrically magnetized magnet 40 should preferably be with North-South poles oriented along a line tangent to the rotational path of the turret 30. If field strength is measured the output must be linearized and the output of the sensor is sensitive to temperature, which affects the field strength of the magnet, and to extraneous magnetic fields, so that a magnetic field strength sensor may need to be temperature compensated and shielded.

It should be understood that although an existing CMOS Hall effect sensor, namely Melexis part number MLX 90316, can be used in the rotational position sensor 20 other similar sensors can be used. Melexis part number MLX 90316 incorporates an integrated magneto-concentrator which concentrates the applied magnetic flux density which is parallel to the surface of the integrated circuit surface creating an orthogonal component proportional to the applied flux density that can be measured by two pairs of conventional Hall plates located orthogonally under the magneto-concentrator for each of the two directions parallel with the integrated chip surface i.e., X and Y. The sensor encodes a mechanical angle into two sinusoidal signals with a 90° phase shift i.e., sine and cosine. The Y signal is divided by the X signal and an arctangent function implemented by lookup table is applied to the ratio to calculate the measured angle. Melexis part number MLX 90316 is designed to measure the 360 degree angular position of a north-south magnet rotating about an axis which passes through the MLX 90316 sensor so that the magnet is positioned over the integrated chip in a plane parallel to the Hall effect sensors contained in the sensor chip. Alternatively the MLX 90316 sensor has been used with a diametrically magnetized ring magnet that surrounds a rotating shaft, the axis of the shaft being offset from the sensor. However, for the rotating position sensor 20 of this invention the programmable features of the MLX 90316 sensor which allow the output transfer characteristics to be fully programmable, are used to create, not a 360° position sensor but an angle position sensor which measures angles of about 90°-100°. The angle position sensor uses a magnet offset from the chip in roughly the plane of the Hall sensors on the chip, wherein the magnet is mounted for rotation about an axis of which does not pass through the sensor, the chip or the magnet, and the magnet rotation axis being spaced further from the sensor then the magnet.

It should be understood that, degrees of freedom, is to be understood in the conventional engineering sense, where a body in free space has 6 degrees of freedom, rotation about three orthogonal axes, and translation in three orthogonal directions. A body fixed to move on a plane has 3 degrees of freedom, one rotational axis and two translational directions. When the body is said to have a degree of freedom, this is not contradicted by the body being constrained within a range with respect to said degree of freedom, i.e. a rotational degree of freedom remains a degree of freedom even if rotation is restricted to less than 360° of rotation.

It is understood that the invention is not limited to the particular construction and arrangement of parts herein illustrated and described, but embraces all such modified forms thereof as come within the scope of the following claims.

The invention claimed is:

1. An angular position sensor comprising:
    a shaft termination mounted to a fixed structure by a universal joint having two rotational degrees of freedom;
    a turret mounted with a single rotational degree of freedom about a first axis to the fixed structure and linked to the shaft termination by a structure with a second degree of freedom, such that the shaft termination retains two degrees of freedom;
    a magnet fixedly mounted to the turret so that as the turret rotates in the single rotational degree of freedom the magnet moves along a portion of a circular arc spaced from and centered on the first axis;
    a magnetic field sensor fixedly mounted to the fixed structure and spaced further from the first axis than the arc defined by the magnet, so that the magnet is movable along the arc between the first axis and the magnetic field sensor; and
    wherein the single rotational degree of freedom of the turret produces rotation in a single plane that moves the magnet and provides an output from the magnetic field sensor that reflects only rotation of the shaft termination about the first axis.

2. The angular position sensor of claim 1 wherein the magnetic field sensor measures field orientation.

3. The angular position sensor of claim 1 wherein the turret has a cylindrical base that rotates in a bearing formed by portions of a housing to which the magnetic field sensor is fixed.

4. The angular position sensor of claim 3 wherein the housing is mounted to a fixed ball stud which forms one half of the universal joint with the shaft termination.

5. The angular position sensor of claim 4 wherein the shaft termination has portions defining a pair of trunnions that mount to the turret and allow the shaft termination to pivot about a second axis perpendicular to the first axis and provide the second degree of freedom between the turret and the shaft termination.

6. The angular position sensor of claim 5 wherein the pair of trunnions are arranged to move along arcuate tracks that allow rotation about a center of curvature that is the second axis, wherein the second axis does not pass through the trunnions.

7. The angular position sensor of claim 5 wherein the pair of trunnions are arranged to rotation about the second axis so that the second axis passes through the trunnions.

8. The angular position sensor of claim 1 wherein the turret is constrained to an arc of less than 50° on either side of the magnet.

9. The angular position sensor of claim 1 wherein the magnet is a single diametrically magnetized magnet with a north and a south pole arranged radially with respect to the first axis.

10. The angular position sensor of claim 1 wherein the magnetic field sensor incorporates an integrated magneto-concentrator which concentrates applied magnetic flux density which is parallel to the surface of the integrated circuit surface creating an orthogonal component proportional to the applied flux density is be measured by two pairs of conventional Hall plates located orthogonally under the magneto-concentrator for each of two directions parallel with the Hall plates.

11. The angular position sensor of claim 10 wherein the magnetic field sensor is a Melexis part number MLX 90316.

12. An angular position sensor comprising:

a fixedly mounted ball stud, having a stud terminated by a ball, the ball stud defining a first axis which forms an axis of symmetry of the stud and passes through a center defined by the ball;

a housing surrounding the stud and mounted to the stud so as to prevent rotation of the housing;

a shaft termination mounted to the ball to form a universal joint having two rotational degrees of freedom;

a turret mounted with a single rotational degree of freedom about the first axis to the housing, the turret having portions through which the ball stud extends, so that the turret rotates about the ball stud, the turret linked to the shaft termination by a hinge which provides rotation about a second axis substantially perpendicular to the first axis and which provides a second degree of freedom, such that the shaft termination retains two degrees of freedom;

a magnet fixedly mounted to the turret so that as the turret rotates in the single rotational degree of freedom the magnet moves along a portion of a circular arc spaced from and centered on the first axis;

a magnetic field orientation sensor fixedly mounted to the housing and spaced further from the first axis than the arc defined by the magnet, so that the magnet is movable along the arc between the first axis and the magnetic field sensor; and wherein the single degree of freedom of the turret produces rotation in a single plane that moves the magnet and provides an output from the magnetic field sensor that reflects only rotation of the shaft termination about the first axis.

13. The angular position sensor of claim 12 wherein the turret is constrained to move on the arc less than 50° on either side of the magnet.

14. The angular position sensor of claim 12 wherein the magnet is a single diametrically magnetized magnet with a north pole and a south pole arranged radially with respect to the first axis with the north pole positioned further from the first axis than the south pole is positioned from the first axis.

15. The angular position sensor of claim 12 wherein the hinge further comprises portions of the shaft termination forming a pair of trunnions which mount to the turret and allow the shaft termination to pivot about a second axis perpendicular to the first axis and providing the second degree of freedom between the turret and the shaft termination.

16. The angular position sensor of claim 12 wherein the magnetic field sensor incorporates an integrated magneto-concentrator which concentrates applied magnetic flux density which is parallel to the surface of the integrated circuit surface creating an orthogonal component proportional to the applied flux density is be measured by two pairs of conventional Hall plates located orthogonally under the magneto-concentrator for each of two directions parallel with the Hall plates.

17. The angular position sensor of claim 12 further comprising the ball stud being mounted to one side of a hinge, and the shaft termination mounted to a gas strut which is mounted to an other side of the hinge, the hinge defining an hinge axis wherein the symmetry axis of the ball stud is approximately parallel to the hinge axis.

* * * * *